United States Patent [19]

Carroll et al.

[11] Patent Number: 5,502,741

[45] Date of Patent: Mar. 26, 1996

[54] DIRECT AMPLITUDE MODULATION OF LASERS

[75] Inventors: John E. Carroll; Mark C. Nowell, both of Cambridge, United Kingdom

[73] Assignee: Northern Telecom Limited, Montreal, Canada

[21] Appl. No.: 216,301

[22] Filed: Mar. 22, 1994

[51] Int. Cl.$^6$ ............................ H01S 3/096; H01S 3/10; H01S 3/18

[52] U.S. Cl. ........................... 372/96; 372/26; 372/50

[58] Field of Search ........................... 372/96, 26, 31, 372/102, 43, 45, 46, 50

[56] References Cited

U.S. PATENT DOCUMENTS

| | | | |
|---|---|---|---|
| 4,932,034 | 6/1990 | Usami et al. | 372/96 |
| 5,170,402 | 12/1992 | Ogita et al. | 372/96 |
| 5,274,649 | 12/1993 | Hirayama et al. | 372/96 |

OTHER PUBLICATIONS

Yoshikumi, "Independent Modulation in Amplitude And Frequency Regimes . . . ", Feb. 1986 Optical Fiber Communication Conference, pp. 32–33.
Nilsson, "Formulas For Direct Frequency Modulation Response . . . ", Electronic Letters, vol. 23, No. 25, Dec. 3, 1987, pp. 1371–1372.
Macenac, "Quantrum–Mechanical Model For Realistic Fabry–Perot Lasers", IEE Proceedings–J, vol. 140, No. 3, Jun. 1993, pp. 157–171.
White, "Line Narrowed Picosecond Optical Pulse Generation . . . ", Electronics Letters, vol. 28, No. 13, Jun. 18, 1992, pp. 1257–1258.
Nowell, "Comparisons of Modeling Methods, Applied to Low Chirp Push–Pull DFB Structures", Abstract From SIOE '93 Proceedings, Oct. 1993.
Nowell, "Chirp Reduction Using Push–Pull Modulation of Three Contact Lasers", Accepted To Be Published Dec. 1993, 14 pages.
Yoshiikumi, "Multielectrode Distributed Feedback Laser For Pure Frequency . . . ", Journal of Lightwave Technology, vol. LP–5, No. 4, Apr. 1987, pp. 516–522.
Nilsson, "Small–Signal Response Of A Semiconductor Laser . . . ", Applied Physics Letters, vol. 46, No. 3, 1 Feb. 1985, pp. 223–225.
Hale, "Vector Modulation of Split–Contact DFB Lasers", IEE Proceedings–J, vol. 138, No. 2, Apr. 1991, pp. 109–112.
Griffin, "Substantial Reduction of Dynamic Wavelength Chirp . . . ", Electronics Letters, vol. 28, No. 22, Oct. 22, 1992, pp. 2045–2046.
Olesen, "Proposal of Novel Gain–Levered MQW DFB Lasers . . . ", IEEE Photonics Technology Letters, vol. 5, No. 6, Jun. 1993, pp. 599–602.

Primary Examiner—Rodney B. Bovernick
Assistant Examiner—Robert McNutt
Attorney, Agent, or Firm—Lee, Mann, Smith, McWilliams, Sweeney & Ohlson

[57] ABSTRACT

A DFB laser is provided with a top electrode divided symmetrically into two or three in-line separate elements through which a bias current is applied with a symmetrical distribution and through which a modulation current is applied with an antisymmetric (push-pull) distribution.

6 Claims, 4 Drawing Sheets

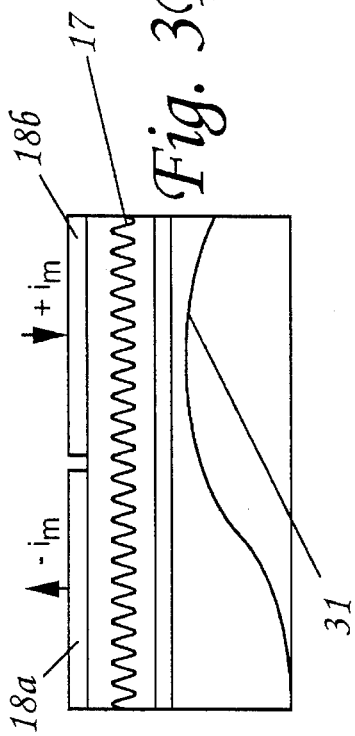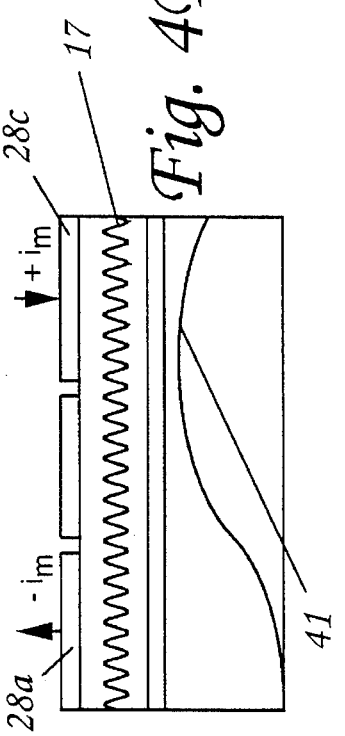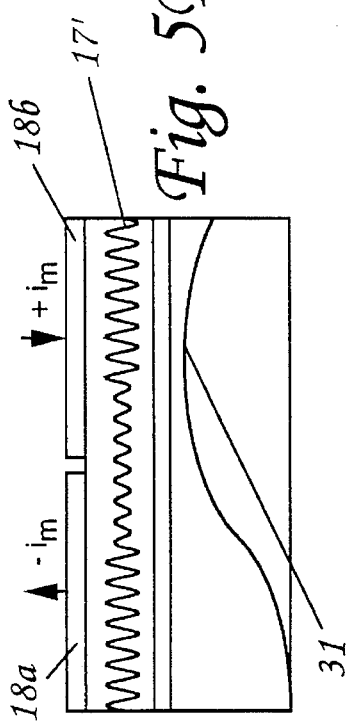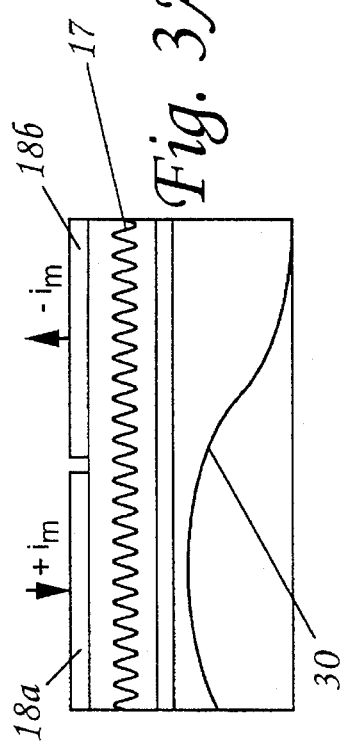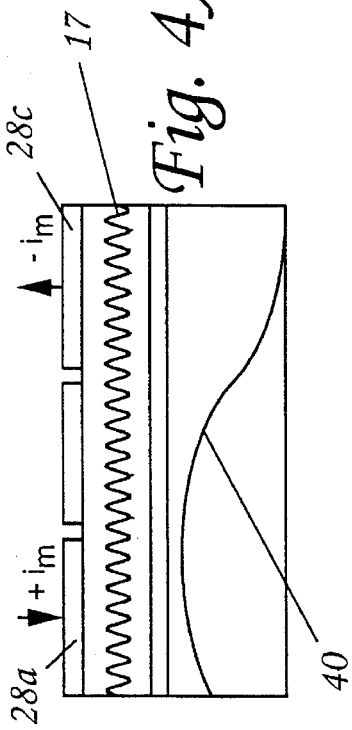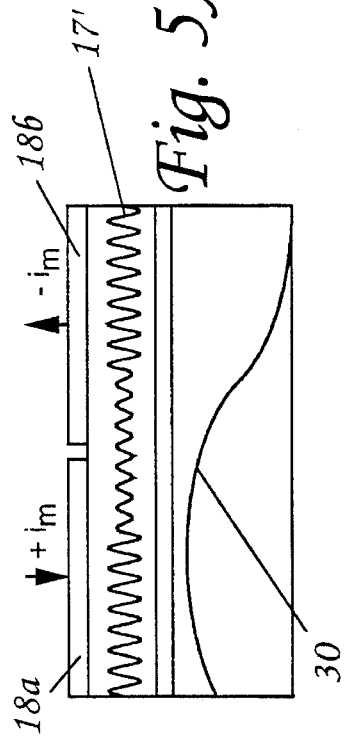

DIRECT AMPLITUDE MODULATION OF LASERS

BACKGROUND

This invention relates to the minimising of chirp in high speed amplitude modulation of DFB lasers.

Modulation of the injection current of a semiconductor distributed feedback (DFB) laser is liable to produce variation in both the intensity and the wavelength of its emission. This wavelength variation is called chirp. Chirp imposes bandwidth limitations in amplitude modulated transmission systems that exhibit wavelength dispersion.

A paper entitled 'Independent modulation in amplitude and frequency regimes by a multi-electrode distributed –feedback laser' presented by Y Yoshikuni et al at the Feb. 25 1986 Optical Fiber Communication Conference in Atlanta, Georgia describes a DFB laser with a uniform physical pitch grating where the top electrode of the laser is divided into three in-line sections, at least one of which is driven independently of the others. In particular, the paper states that differences in modulation efficiencies make it possible to modulate amplitude and frequency independently by adjusting the modulation current amplitude and phase applied to the divided electrode structure, and illustrates achieving amplitude modulation with minimum chirp by applying a first signal to the front portion of the divided electrode slightly ahead in phase of the application of a second signal of smaller amplitude to the centre portion of the divided electrode structure. Correspondingly frequency modulation with minimum amplitude modulation is described as being achieved with the first current being of larger amplitude than the second and in substantial antiphase (push-pull) relationship.

A paper by O Nilsson et al entitled, 'Formulas for Direct Frequency Modulation Response of Two-Electrode Diode Lasers: Proposals for Improvement', Electronics Letters 3rd December 1987, Vol 23, No 25, pages 1371–2 describes the theory of operation of a two-electrode laser structure designed for frequency modulation rather than for amplitude modulation. According to this theory thermal effects produce a phase shift, but it is postulated that the thermal effect could be avoided by pumping the laser in push pull. It is however particularly to be noted that this push-pull operation of a two-electrode laser is in the context of a device structured to provide frequency modulation rather than amplitude modulation, and the paper explains that the two sections are required to have different $\alpha$-parameters in order to provide the desired frequency modulation. Thus it is clear that this suggestion to employ push-pull is specifically in respect of a laser diode that is not symmetrical about the plane separating the two sections of that laser.

Neither of the above referenced papers is however directly concerned with dynamic chirp, by which term is meant the transient effects upon emission frequency occurring at the rising and falling edges of fast pulses. As the data rate is increased so this dynamic chirp assumes greater significance as a potential problem. Dynamic chirp is believed to result in major part from the effect of changes in total photon population in the laser associated with the rising and falling edges of the injection modulation current, and so the elimination of a frequency modulation response to injection current modulation in the manner proposed in the above references does not address the particular problem of dynamic chirp.

A paper that does address this dynamic chirp problem is the paper by I H White et al entitled 'Line Narrowed Picosecond Optical Pulse Generation Using Three Contact InGaAsP/InP multi-quantum Well distributed Feedback Laser under Gain Switching', Electronics Letters Vol. 28, No 13, pages 1257–8. As the title implies, the laser has a three section top electrode, of which the two end sections are electrically commoned. Dynamic chirp is reduced by arranging to gain-switch the commoned end sections while a constant bias is applied to the middle section in such a way as to provide an effective optical injection locking mechanism. The central region causes locking of the wavelength of gain-switched pulses generated by the electrical modulation applied to the end regions. This reduces chirp, but insofar as it still leaves a modulation of the photon population, the approach is not fully effective.

SUMMARY OF THE INVENTION

Accordingly it is a general object of the present invention to provide a method of amplitude modulating the optical emission of a DFB laser in such a way as to minimise dynamic chirp.

According to the present invention there is provided a method of amplitude modulating a distributed feedback (DFB) laser that has a DFB optical cavity defining an optical axis of laser emission therein, which optical cavity has a plane of substantial symmetry normal to said axis, in which method a bias current, which is distributed substantially symmetrically with respect to said plane of substantial symmetry is applied to the DFB optical cavity upon which bias current is superimposed and modulation current distributed substantially anti-symmetrically with respect to said plane.

The anti-symmetric modulation current operates in a push-pull mode to keep substantially constant the total photon population (photonic energy) within the laser while at the same time shifting the centre of gravity of the photon density back and forth along the laser axis so that the emission from the laser occurs predominantly first from one end and then from the other.

BRIEF DESCRIPTION OF THE DRAWINGS

There follows a description of the preferred embodiments of the invention. In this description reference is made to the accompanying drawings in which:

FIGS. 3A, 3B, 4A, 4B, 5A and 5B are diagrammatic representations illustrating the modulation of photon density in the lasers of FIGS. 1 and 2;

FIGS. 6A and 6B illustrate different pulse waveforms for modulating the lasers of FIGS. 1 and 2;

FIG. 9 is a graphical plot of the modelled spectral width of a laser modulated in accordance with the teachings of the present invention.

DETAILED DESCRIPTION OF THE PREFERRED EMBODIMENTS

Figure 1:
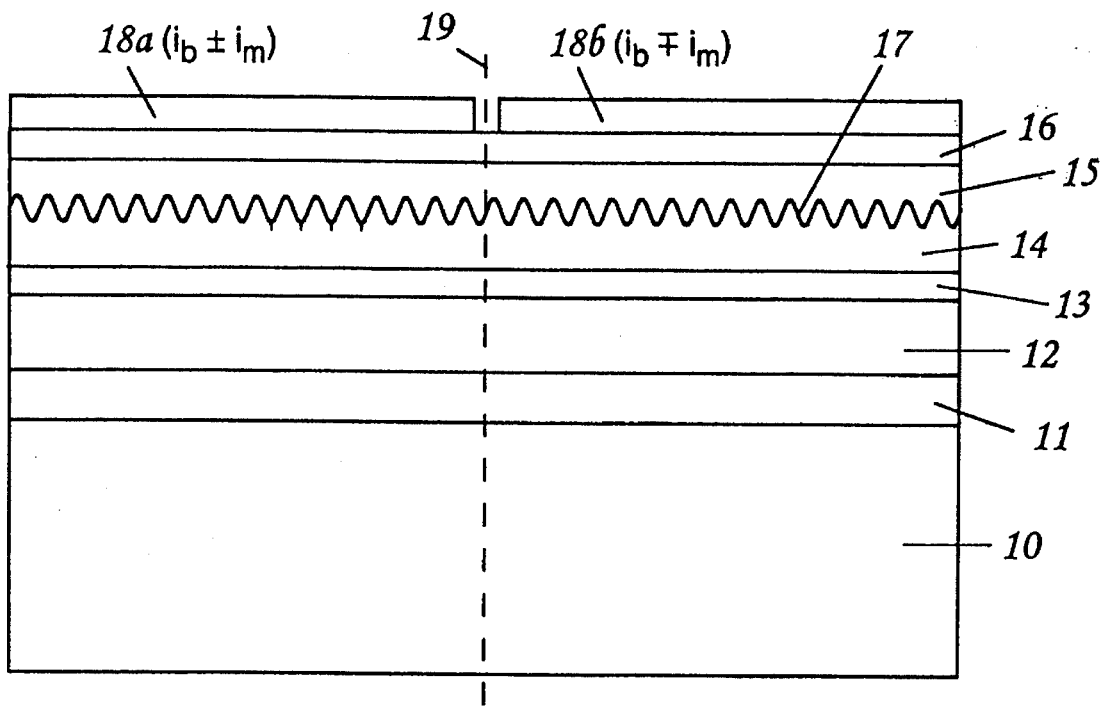
FIGS. 1 and 2 depict schematic longitudinal sections respectively of two-section and three-section top electrode DFB lasers.

A preferred form of basic semiconductor structure of DFB laser to which the method of amplitude modulation according to the present invention is applied is a conventional DFB laser structure with the single major difference that preferably the distributed feedback grating is without any phase shift. Such a basic semiconductor structure may for instance comprise, as depicted in FIG. 1, an n-type InP substrate 10 upon which is grown a series of epitaxially deposited layers commencing with an n-type InP buffer layer 11. On top of the buffer layer is grown an undoped quaternary lower waveguide layer 12, a multi-quantum well (MQW) structure 13, an undoped quaternary upper waveguide layer 14, a p-type InP cladding layer 15 and a p-type ternary contact layer 16. The MQW structure 13 may typically comprise about six quantum strained or unstrained well layers of ternary or quaternary material sandwiched between barrier layers which may have the same composition as that of the upper and lower waveguide layers 14 and 12. The epitaxial growth is temporarily halted after the growth of the upper waveguide layer in order to pattern the exposed surface of that layer to form, for instance by electron beam lithography, a DFB grating 17 before recommencement of the epitaxial growth to grow layers 15 and 16. In an alternative structure (not shown) the DFB grating is located beneath the MQW structure instead of on top of it, and is created immediately after growth of the buffer layer 11.

Figure 2:
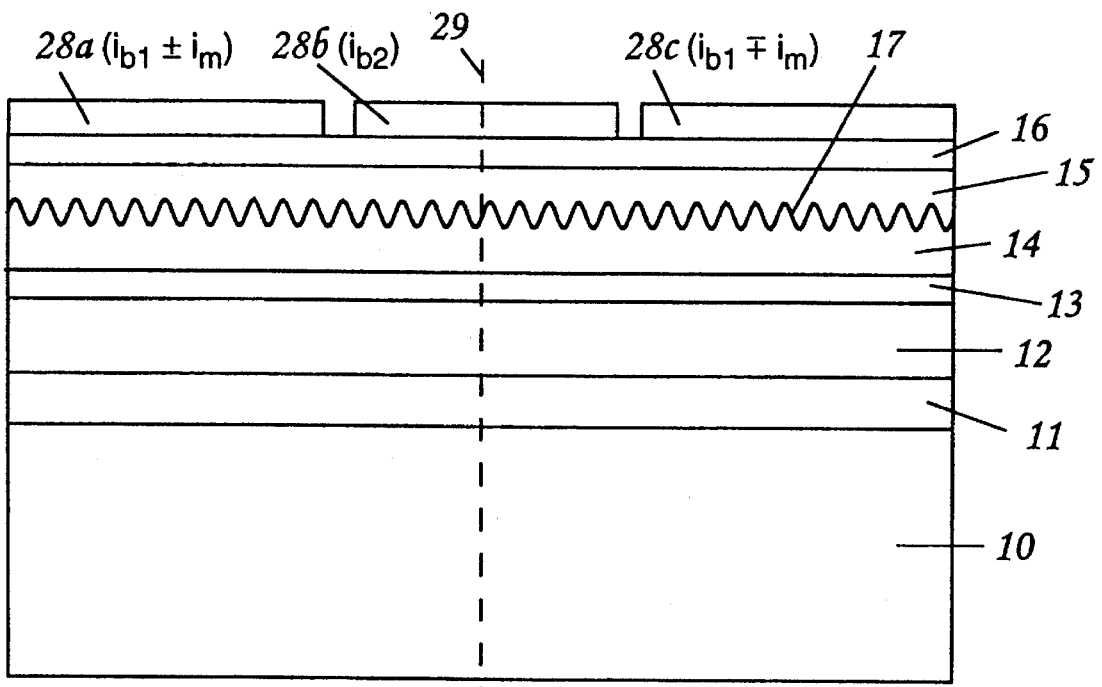

The above described layer structure provides waveguiding properties in the direction normal to the plane of the layers. Lateral waveguiding is also provided by known means, for instance by means of a ridge waveguide structure or by means of a buried heterostructure, and in this way an optical axis for the laser is defined, this axis extending in the plane of the layer in a direction at right angles to the direction in which the grating lines of the DFB structure 17 extend. Usually a DFB laser has a single top electrode making electrical contact with the contact layer 16, but in this instance the top electrode is divided into two in-line sections 18a, 18b as depicted in FIG. 1 or three in-line sections 28a, 28b, and 28c as depicted in FIG. 2.

The arrangement of the top electrode sections is such as to retain a plane of substantial symmetry (indicated by a broken line 19, 29) for the semiconductor laser structure and its electrode structure. The laser is thus provided with a structure that confines the photons laterally and perpendicular to the plane of the epitaxial layers, and now by means of the divided top electrode structure is provided with a facility for modulating the distribution of the photons along the optical axis of the laser by modulation of the distribution of the injection current applied to the laser via its top electrode structure. By arranging for the laser to be supplied with a bias current that is distributed substantially symmetrically with respect to the symmetry plane 19, 29, and by superimposing on this a modulation current that is distributed substantially anti-symmetrically (i.e., in push pull) with respect to that plane, the modulation has the effect of shifting the centre of gravity of the total photon population axially back and forth along the optic axis while maintaining that population (photonic energy) substantially constant. In the case of the two-element top electrode configuration of FIG. 1, these symmetry relationships are provided by applying, to the respective elements 18a and 18b, currents of the form $(i_b \pm i_m)$ and $(i_b \mp i_m)$, where $i_b$ is the bias current and $i_m$ is the modulation current. (For the sake of ilustration, under the condition $i_b = i_m$, the total current drive would alternate between application solely through element 18d and application solely through element 18b). In the case of the three-element top electrode configuration of FIG. 2, the required symmetry relationships are provided by applying, to the respective elements 28a, 28b and 28c, currents of the form $(i_{b1} \pm i_m)$, $i_{b2}$ and $(i_{b1} \pm i_m)$.

Trace 30 of FIG. 3a is a schematic graphical representation of the photon density distribution in a two-section top electrode laser at an instant when the modulation current applied to the left-hand section 18a is greater than that applied to the right-hand section 18b, and indicates that under these circumstances the centre of gravity of the photon distribution is displaced to the left of the plane of the symmetry 19. Conversely trace 31 of FIG. 3b is an equivalent representation of the distribution that obtains when the modulation current applied to the right-hand section 18b is the greater. Traces 40 and 41 of FIGS. 4A and 4B, schematically depict the equivalent photon density distributions in respect of the three-section top electrode laser. In respect of light emitted from the right-hand end of the laser, the condition represented in FIGS. 3A and 4A is the OFF state, while that of FIGS. 3B and 4B is the ON state.

Since the modulation leaves the photonic energy substantially constant, the net rate of stimulated recombination of electrons from the conduction band averaged over the laser is thereby controlled so that the electronic contribution to the refractive index is substantially invariant. With substantially no change in the electronic contribution to the refractive index, the dynamic chirp of the laser can be minimised and approach towards zero. Due to the symmetry of the device and its modulation, there is substantially no change in the optical frequency between the two post-transient modulation states, and hence static chirp is also minimised.

One of the differences between the three section top electrode structure of FIG. 2, and the two-section structure of FIG. 1, is that the former can be employed to store more photonic energy within the laser and thus further help in the stabilisation of the frequency of emission. On the other hand, having three contacts tends to slow down the speed with which the centre of gravity of the photonic energby shifts from one end of the device to the other. Any dynamic chirp that remains is dynamic chirp that is generated during these energy shifts, and hence the faster the switching, the less is the time that the optical emission frequency is perturbed, and the less is the magnitude of the dynamic chirp. An increase in the storage of phonic energy can also be obtained by having a non-uniform DFB strategy as depicted at 17' in FIGS. 5A and 5B. The effective pitch of the grating 17' remains constant over the whole length but the amplitude, and hence also the coupling coefficient, of the centre section is reduced in comparison with that of the two end sections The best laser will have an optimum trade-off between storing enough photonic energy, which reduces line width, but not so much energy as to get too heavily confined to the central section of the laser, which confinement has the result of lowering the contrast ratio between OFF and ON states. In FIGS. 3, 4 and 5 this contrast ratio is indicated by the difference in height of the two ends of the traces 30, 31, 40 and 41. The light output is proportional to the energy divided by the group velocity, making proper allowance for facet reflections if any. It is found that the minimum line width is formed by adjusting the bias currents and modulation currents within the laser in a normal experimental manner. Practical lasers will not be precisely uniform, and in view of departures from precise symmetry of physical structure, there will be an optimum drive that will minimise the change of frequency.

The aim throughout the process of amplitude modulation is to keep the frequency as uniform in time as the fundamental physics of modulation permit. In the detailed modelling of the laser, using modelling techniques derived from those described by DD Marcenac and J E Carroll entitled 'Quantum-Mechanical Model for Realistic Fabry-Perot Lasers', IEE Proceedings Part J, Vol. 140, No. 3, pp 157–171 (June 1993), it is noted that, as the laser is switched from the on to the off state so there is a fall in the electron density and a fall in the frequency. One way of combating this 'switch over' chirp is to have an overshoot on the section which is being turned on, as depicted in FIG. 6A. An alternative and perhaps superior way is to provide a slower fall time for the section which is being turned off, as depicted in FIG. 6B, so that the electrons are not stimulated to recombine too fast in that section because it is this too rapid recombination which changes the refractive index of that section, and thus changes the lasing frequency.

Figure 7:
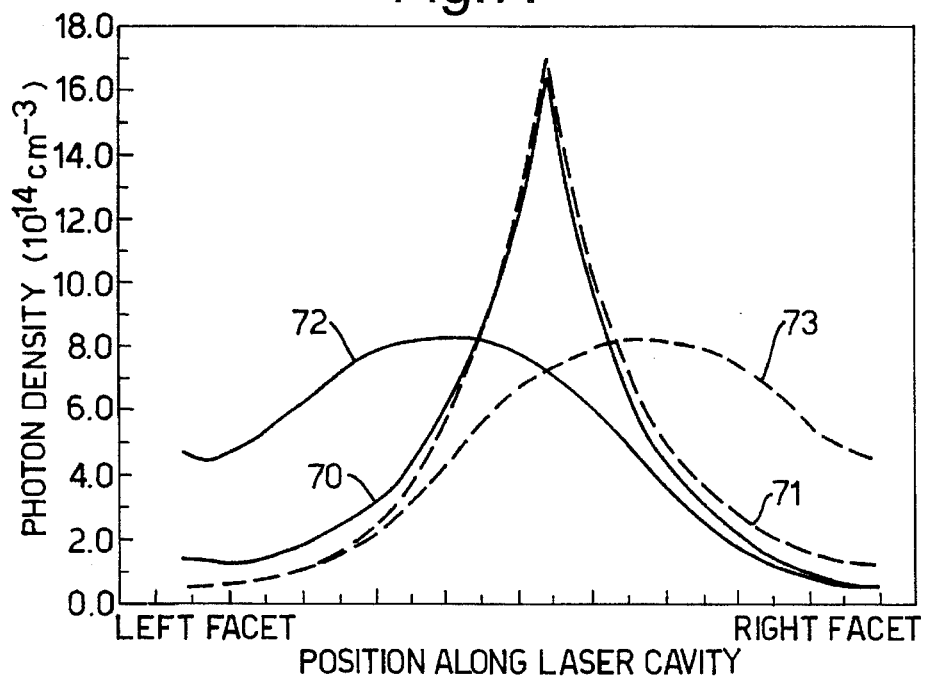
FIG. 7 is a graphical plot comparing the modelled photon density distribution obtained in respect of DFB lasers with and without phase shifts in their DFB gratings.
Figure 8:
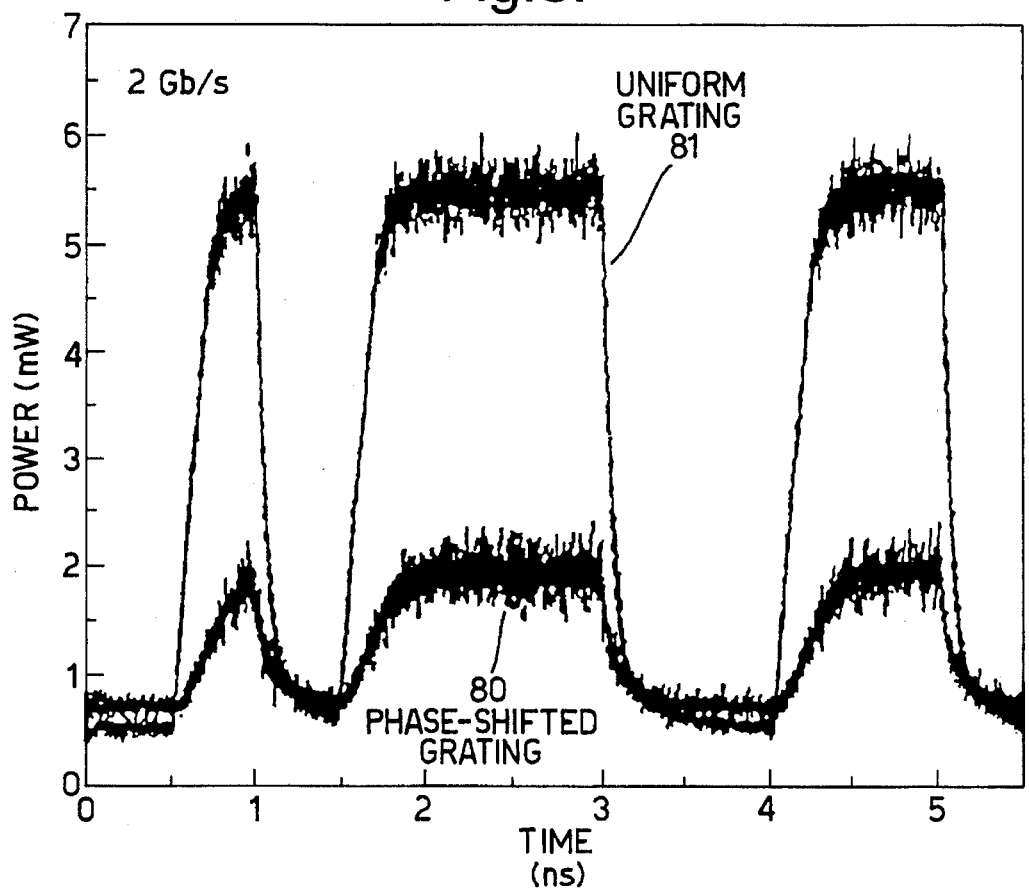
FIG. 8 is a graphical plot of the modelled response of the lasers of FIG. 7 to modulation with a particular bit sequence.
Figure 7:
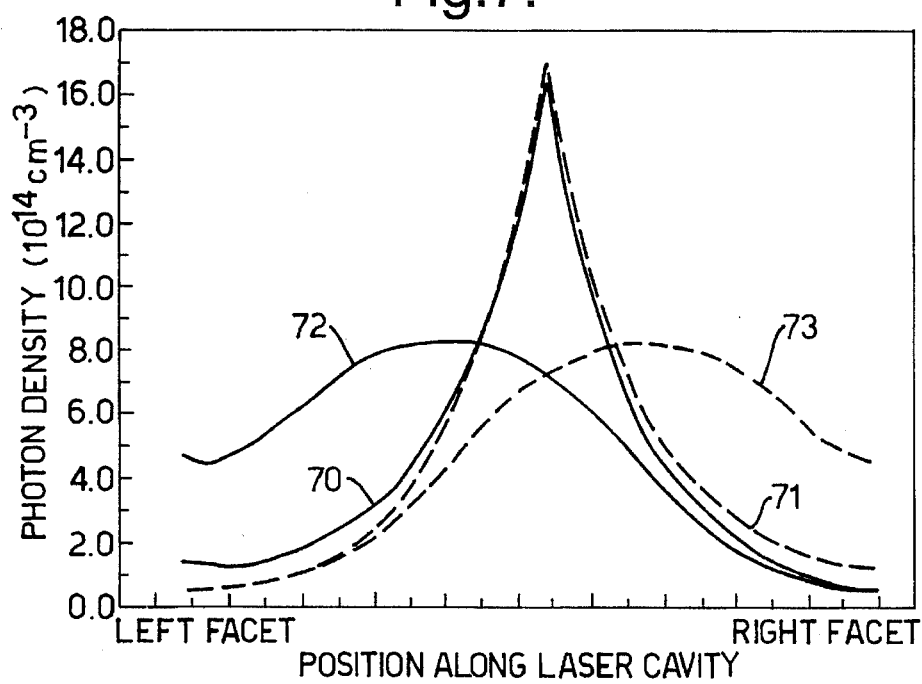
Figure 8:
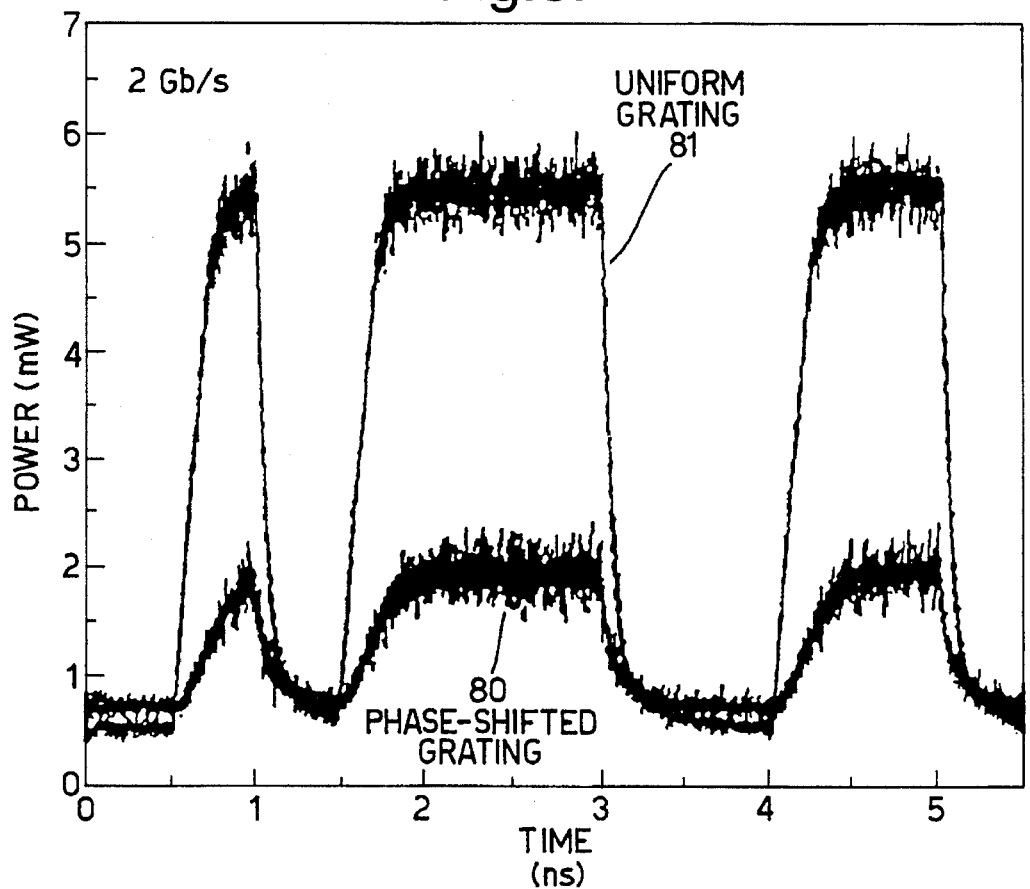

It has been stated previously that it is preferred to employ a DFB laser that does not incorporate a phase change in its DFB grating structure. The reason for this preference is that a phase change has the effect of locking a large proportion of the photonic energy, thereby reducing the contrast ratio that is obtainable with the modulation. This effect shows up clearly in FIGS. 7 and 8. FIG. 7 compares the modelled photon density distribution changes resulting from push-pull modulation of a DFB laser incorporating a $\lambda/4$ phase shift at its mid point, traces 70 and 71, with the corresponding changes, traces 72 and 73, in respect of the same modulation applied to an equivalent DFB laser with no phase shift modulation applied to an equivalent DFB laser with no phase shift structure in its grating. FIG. 8 compares the modelled power output of the two lasers when push-pull modulated with a 2 Gb/s signal. In this Figure trace 80 describes the output of the laser with the phase shift in its grating, and trace 81 describes that of the laser without any phase shift in its grating. Finally, FIG. 9 depicts the modelled output spectrum of the laser without any phase shift in its grating when push-pull modulated with a 2 Gb/s signal. This indicates a –20 dB linewidth of 6.3 GHz, which compares with linewidths in the region of 40 GHz for similarly modulated conventional single section top electrode $\lambda/4$ phase shifted DFB lasers.

We claim:

1. A method of amplitude modulating a distributed feedback (DFB) laser that has a DFB optical cavity defining an optical axis of laser emission therein, which optical cavity has a plane of substantial symmetry normal to said axis, in which method a bias current, which is distributed substantially symmetrically with respect to said plane of substantial symmetry is applied to the DFB optical cavity, upon which bias current is superimposed a modulation current distributed substantially anti-symmetrically with respect to said plane.

2. A method as claimed in claim 1 wherein the DFB laser has a DFB grating structure without phase shift.

3. A method as claimed in claim 2 wherein modulation current is applied in the form of pulses having rising and falling edge, and wherein the rising edges exhibit an overshoot while the falling edges exhibit substantially no overshoot.

4. A method as claimed in claim 2 wherein the current modulation is applied in the form of pulses having rising and falling edges, and wherein the falling edges are slower than the rising edges.

5. A DFB laser having a DFB optical cavity defining an optical axis and provided with an electrode structure by means of which current can be injected into said cavity to cause the DFB laser to lase, wherein said structure is a divided structure that permits the current injection to be established with a distribution along the optical axis that can be varied, wherein the DFB optical cavity has a plane of symmetry normal to the optical axis, which DFB laser is provided with drive means adapted to apply to the divided electrode structure a bias current upon which is superimposed a modulation current that is applied anti symmetrically with respect to the plane of symmetry of the optical cavity so as to operate in push-pull mode.

6. A DFB laser as claimed in claim 5, which laser has a DFB grating structure without phase shift.

* * * * *